(12) United States Patent
Mizutani et al.

(10) Patent No.: US 10,012,980 B2
(45) Date of Patent: Jul. 3, 2018

(54) MODIFYING OPERATIONAL EFFICIENCY BY REPOSITIONING PROCESS APPARATUS

(71) Applicant: TOKYO ELECTRON LIMITED, Tokyo (JP)

(72) Inventors: Taku Mizutani, Tokyo (JP); Ichiro Namioka, Tokyo (JP); Toshihiko Iijima, Tokyo (JP); Shigenori Todate, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 626 days.

(21) Appl. No.: 14/303,059

(22) Filed: Jun. 12, 2014

(65) Prior Publication Data

US 2014/0297017 A1    Oct. 2, 2014

Related U.S. Application Data

(63) Continuation of application No. PCT/JP2012/078923, filed on Nov. 8, 2012.

(30) Foreign Application Priority Data

Dec. 13, 2011  (JP) .................................. 2011-272476

(51) Int. Cl.
*G05B 19/41* (2006.01)
*H01L 21/67* (2006.01)
(Continued)

(52) U.S. Cl.
CPC .................... *G05B 19/4189* (2013.01); *G05B 2219/31277* (2013.01); *G05B 2219/32271* (2013.01);
(Continued)

(58) Field of Classification Search
None
See application file for complete search history.

(56) References Cited

U.S. PATENT DOCUMENTS

| 4,425,537 A | * | 1/1984 | Phillips | ................. G06T 3/0068 |
| | | | | 318/480 |
| 4,442,388 A | * | 4/1984 | Phillips | .................... G03F 9/70 |
| | | | | 250/548 |

(Continued)

FOREIGN PATENT DOCUMENTS

| JP | 2000-156398 A | 6/2000 |
| JP | 2000200822 A | 7/2000 |

(Continued)

OTHER PUBLICATIONS

Farley, E.T. and Haworth, D.A., "The Use of Threshold Logic to Improve Performance in Scheduling", 1998, IEEE.*

(Continued)

*Primary Examiner* — Mohammad Ali
*Assistant Examiner* — Kelvin Booker
(74) *Attorney, Agent, or Firm* — Nath, Goldberg & Meyer; Jerald L. Meyer (57) ABSTRACT

There is provided a production processing system including: a production efficiency improvement device configured to select a processing apparatus that processes workpieces in consideration of a position of each of a plurality of processing apparatuses arranged along a transfer path; and a transfer control device configured to move a transfer apparatus that transfers workpieces from a predetermined position on the transfer path to the selected processing apparatus.

5 Claims, 8 Drawing Sheets

(51) Int. Cl.
*G05B 19/418* (2006.01)
*H01L 21/677* (2006.01)

(52) U.S. Cl.
CPC ............... *G05B 2219/45031* (2013.01); *H01L 21/67276* (2013.01); *H01L 21/67727* (2013.01); *Y02P 80/114* (2015.11); *Y02P 90/20* (2015.11); *Y02P 90/28* (2015.11)

(56) References Cited

U.S. PATENT DOCUMENTS

| | | | | |
|---|---|---|---|---|
| 4,687,980 | A * | 8/1987 | Phillips | G06T 3/20 250/548 |
| 4,977,361 | A * | 12/1990 | Phillips | G03F 9/70 250/201.1 |
| 5,399,531 | A | 3/1995 | Wu | |
| 5,412,863 | A * | 5/1995 | Prodel | B23Q 7/1436 29/33 P |
| 5,587,599 | A * | 12/1996 | Mahnkopf | H01L 27/0623 257/350 |
| 6,269,279 | B1 * | 7/2001 | Todate | G05B 19/41865 700/108 |
| 6,496,952 | B1 * | 12/2002 | Osada | G11C 29/50012 365/194 |
| 6,601,227 | B1 * | 7/2003 | Trimberger | G06F 17/5068 716/113 |
| 6,615,093 | B1 * | 9/2003 | Chung | G05B 19/41875 700/100 |
| 6,777,254 | B1 * | 8/2004 | Yamazaki | H01L 21/0273 257/E27.111 |
| 6,944,842 | B1 * | 9/2005 | Trimberger | G06F 17/5068 716/114 |
| RE39,579 | E * | 4/2007 | Hatakenaka | G06F 11/00 714/718 |
| 7,512,455 | B2 * | 3/2009 | Fromherz | G05B 19/4189 399/66 |
| 8,396,826 | B2 * | 3/2013 | Mijares | E21B 43/00 706/61 |
| 8,781,882 | B1 * | 7/2014 | Arboletti | G06Q 10/0639 705/7.11 |
| 2003/0230031 | A1 * | 12/2003 | Lam | E04H 5/02 52/79.1 |
| 2004/0073336 | A1 * | 4/2004 | Huang | B25J 9/1674 700/245 |
| 2004/0117055 | A1 * | 6/2004 | Seidel | G03F 7/7065 700/121 |
| 2004/0134564 | A1 * | 7/2004 | Mitchell | B27B 1/007 144/1.1 |
| 2004/0159051 | A1 * | 8/2004 | Lam | E04H 5/02 52/79.1 |
| 2004/0210340 | A1 * | 10/2004 | Koike | G05B 19/41865 700/213 |
| 2004/0254674 | A1 * | 12/2004 | Nojo | G05B 19/4189 700/213 |
| 2005/0067617 | A1 * | 3/2005 | Yamazaki | G02F 1/13454 257/59 |
| 2005/0172196 | A1 * | 8/2005 | Osecky | G06F 11/1633 714/746 |
| 2005/0228530 | A1 * | 10/2005 | Chang | H01L 21/67017 700/121 |
| 2007/0090953 | A1 * | 4/2007 | Park | G05B 19/4183 340/572.1 |
| 2007/0240547 | A1 * | 10/2007 | Dick | B27M 1/08 83/76.1 |
| 2008/0047207 | A1 * | 2/2008 | Lam | E04H 5/02 52/79.1 |
| 2008/0111979 | A1 * | 5/2008 | Emoto | G03F 7/70341 355/30 |
| 2010/0030357 | A1 * | 2/2010 | Tilove | G06Q 10/06 700/100 |
| 2010/0249993 | A1 | 9/2010 | Mitsuyoshi | |
| 2011/0007286 | A1 * | 1/2011 | Direcks | G03F 7/70341 355/30 |
| 2011/0222037 | A1 * | 9/2011 | Kiuchi | G03F 7/70341 355/53 |
| 2012/0096421 | A1 * | 4/2012 | Ono | G06F 17/5031 716/113 |
| 2014/0257546 | A1 * | 9/2014 | Mizutani | H01L 21/67276 700/108 |

FOREIGN PATENT DOCUMENTS

| | | |
|---|---|---|
| JP | 2002-359272 A | 12/2002 |
| JP | 2002359272 A | 12/2002 |
| JP | 2003-100576 A | 4/2003 |
| JP | 2004200485 A | 7/2004 |
| JP | 2004281622 A | 10/2004 |
| JP | 2007242854 A | 9/2007 |
| JP | 2007273888 A | 10/2007 |
| JP | 2010238783 A | 10/2010 |
| TW | I425598 | 7/1997 |

OTHER PUBLICATIONS

Gambardella, L.M.; Mastrolilli, M.; Rizzoli, A.E. and Zaffalon, M., "An Optimization Methodology for Intermodal Terminal Management", 2001, Journal of Intelligent Manufacturing, vol. 12.*

Search Report issued in PCT Application No. PCT/JP2012/078923, dated Jan. 29, 2013, two (2) pages.

* cited by examiner

MODIFYING OPERATIONAL EFFICIENCY BY REPOSITIONING PROCESS APPARATUS

CROSS-REFERENCE TO RELATED APPLICATION

This application is a Continuation Application of PCT International Application No. PCT/JP2012/078923, filed Nov. 8, 2012, which claimed the benefit of Japanese Patent Application No. 2011-272476, filed on Dec. 13, 2011, the entire contents of which are incorporated by reference herein.

TECHNICAL FIELD

The present disclosure relates to a production processing system, a production efficiency improvement device and a production efficiency improvement method, which can efficiently control a transfer apparatus transferring a workpiece to a processing apparatus.

BACKGROUND

In a semiconductor production plant, there is a plurality of processing apparatuses to perform various processes for workpieces. In recent years, semiconductor production plants have been expended in scale, and there has been a demand to reduce energy consumption.

For example, there is discloses a technique for achieving energy saving by automatically transitioning from a normal state to an idle state, if standby time of a processing apparatus exceeds a predetermined time. In addition, there is a technique for switching to an operation mode in consideration of recovery time required for a processing apparatus to switch to the operation mode. In this manner, there are various techniques for reducing energy consumption of the processing apparatus.

Workpieces are transferred to each processing apparatus by a transfer apparatus. Some big semiconductor production plants may have thousands of transfer apparatuses. This may require energy consumption of the transfer apparatuses to be limited as well as the processing apparatuses.

There is also a technique for selecting a proper transfer carriage based on predicting when articles can be loaded on a transfer carriage and arrival time of the transfer carriage to a station.

In general, when the workpiece is carried into a processing apparatus, the transfer apparatus circulates on a transfer path and calculates an unloading timing of the workpiece to the processing apparatus until the processing apparatus enters a state where the workpiece can be mounted. While the transfer apparatus is circulating, the transfer apparatus consumes wasteful energy, which has no contribution to the manufacture of semiconductor products.

In addition, there is a technique which selects only a proper transfer carriage, without considering selection of a proper processing apparatus from a plurality of processing apparatuses. This may result in extension of a transfer path, and hence wasteful energy consumption for a transfer.

SUMMARY

The present disclosure provides some embodiments of a production efficiency improvement system, a production efficiency improvement device and a production efficiency improvement method, which can reduce energy consumption of transfer apparatuses.

According to one embodiment of the present disclosure, there is provided a production processing system including: a production efficiency improvement device configured to select a processing apparatus that processes workpieces in consideration of a position of each of a plurality of processing apparatuses arranged along a transfer path; and a transfer control device configured to move a transfer apparatus to transfer the workpieces from a predetermined position on the transfer path to the selected processing apparatus.

According to another embodiment of the present disclosure, there is provided a production efficiency improvement device including an apparatus selecting unit configured to select a processing apparatus that processes workpieces and has the shortest transfer distance from a predetermined position on a transfer path in consideration of a position of each of a plurality of processing apparatuses arranged along the transfer path.

According to another embodiment of the present disclosure, there is provided a production efficiency improvement method comprising selecting a processing apparatus that processes workpieces and has the shortest transfer distance from a predetermined position on a transfer path in consideration of a position of each of a plurality of processing apparatuses arranged along the transfer path.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments of the present disclosure will now be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
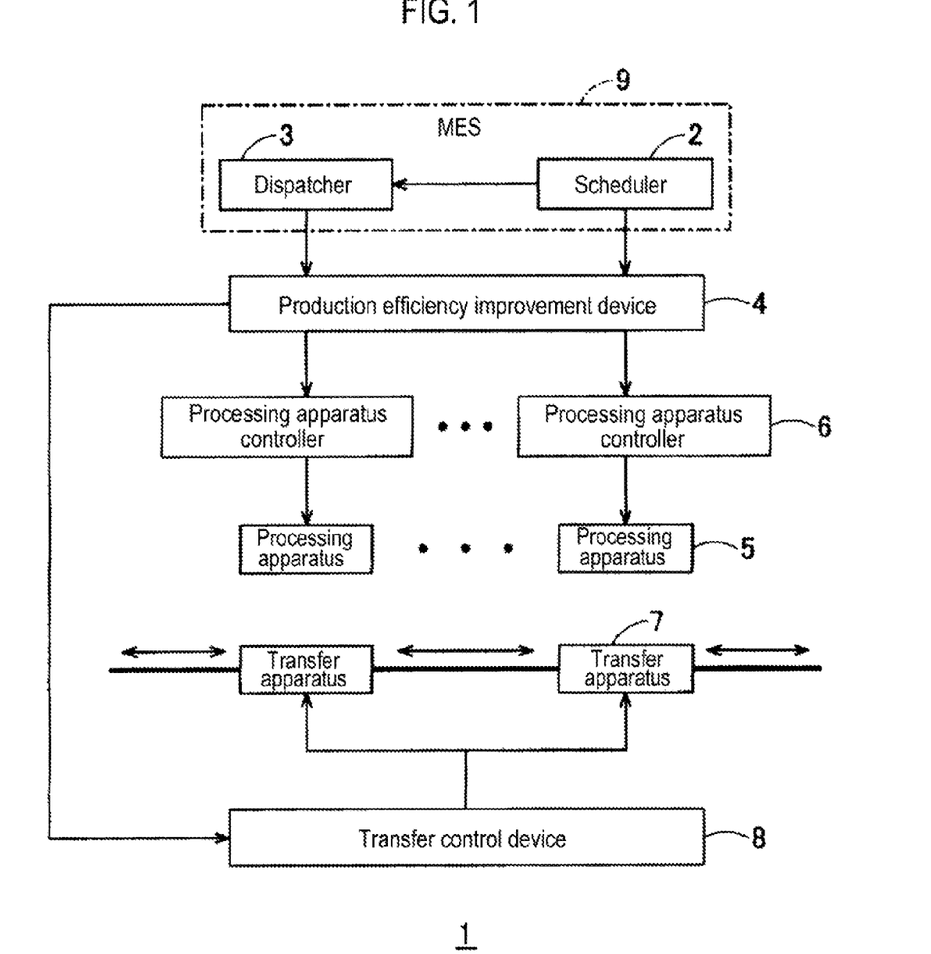
FIG. 1 is a block diagram illustrating a general configuration of a production efficiency improvement system according to a first embodiment of the present disclosure.

FIG. 1 is a block diagram illustrating a general configuration of a production efficiency improvement system according to a first embodiment of the present disclosure. The production efficiency improvement system 1 of FIG. 1 includes a scheduler 2, a dispatcher 3, a production efficiency improvement device 4, a plurality of processing apparatuses 5, a plurality of processing apparatus controllers 6, a plurality of transfer apparatuses 7 and a transfer control device 8.

The scheduler 2 creates a production plan for workpieces (for example, semiconductor devices) in a production plant (for example, a semiconductor manufacturing plant). This production plan is sequentially updated based on a production progress plan.

The dispatcher 3 instructs the plurality of processing apparatus 5 processing the workpieces based on the production plan created by the scheduler 2.

The scheduler 2 and the dispatcher 3 constitute a MES (Manufacturing Execute System) 9 which may be, in actuality, implemented by one or more computers.

The production efficiency improvement device 4 controls the plurality of processing apparatuses 5 based on results of the processing by the scheduler 2 and the dispatcher 3. As will be described later, the production efficiency improvement device 4 in this embodiment includes apparatus location map (not shown) indicating positional information of each processing apparatus 5.

Each processing apparatus 5 is, for example, a plasma CVD device, plasma etching device, sputtering device, PVD device or the like for processing a workpiece such as a glass substrate used to manufacture an organic EL device, a silicon wafer used to manufacture a semiconductor device or the like, regardless of detailed processing contents.

The plurality of processing apparatuses 5 may be classified into a plurality of groups performing different processes with each other, and each group includes two or more processing apparatuses 5 performing the same process. Alternatively, if one process is consecutively performed by the plurality of processing apparatuses 5, these processing apparatuses 5 may be classified into one group and a plurality of groups performing the same process may be installed.

The processing apparatus controller 6 is provided in association with each of the plurality of processing apparatuses 5. Based on an instruction from the production efficiency improvement device 4, the processing apparatus controller 6 controls an operation of the associated processing apparatus 5 and detects signals from various types of sensors (not shown) connected to the processing apparatus 5. The sensors are not particularly limited in type and may be used to measure temperature, humidity, gas flow rate, degree of vacuum and so on within a chamber in the processing apparatus 5.

Each transfer apparatus 7 is, for example, a transfer shuttle running on a track installed on a ceiling or a floor, an automated transfer vehicle running on a predetermined route, etc., and transfers a transfer container (carrier). Based on an instruction from the transfer control device 8, the transfer apparatus 7 transfers workpieces accommodated in the carrier while being moved between the plurality of processing apparatuses 5 and a stoker storing the carrier.

The transfer control device 8 constitutes a so-called MCS (Material Control System) and controls an operation of the transfer apparatus 7 based on a transfer plan created at the scheduler 2.

Figure 2:
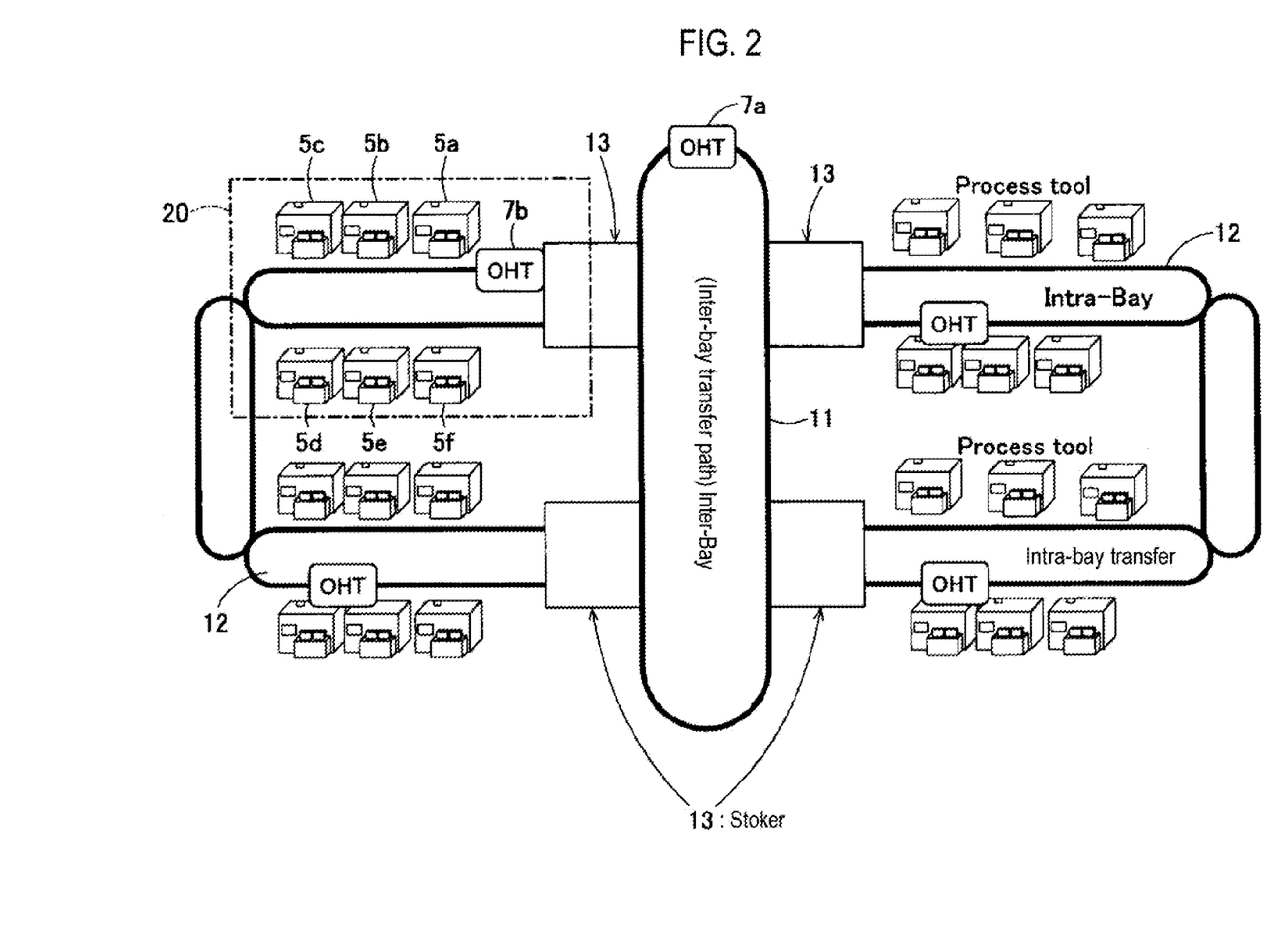
FIG. 2 is a view illustrating one example of a transfer path of a transfer apparatus 7.

FIG. 2 is a view illustrating one example of a transfer path of the transfer apparatus 7. FIG. 2 shows a transfer path of a workpiece in one process. As shown, an inter-bay transfer path 11 for performing a transfer between processes is provided in a central portion. In addition, intra-bay transfer paths 12 are provided at both sides.

The left and right intra-bay transfer paths 12 have a U-like shape. The inter-bay transfer path 11 is connected to entrances of both end portions of the intra-bay transfer paths 12. Stokers 13 temporarily storing workpieces such as wafers and so on are provided at the entrances of both end portions of the intra-bay transfer paths 12. Workpieces transferred from the inter-bay transfer path 11 are first stored at the stokers 13, drawn out at a desired timing and then transferred to the intra-bay transfer paths 12. In this manner, the stokers 13 are provided to absorb a deviation between the process completion timing in each processing apparatus 5 and the transfer timing in the previous or the next process.

The intra-bay transfer paths 12 are U-like shaped rails installed at, for example, a ceiling or a floor. A transfer apparatus 7 (OHT: Overhead Hoist Transfer) runs on the rails and includes a hoist mechanism to be vertically moved by a belt drive. Upon reaching just above the processing apparatus 5 to process the workpiece, the transfer apparatus 7 descends due to the hoist mechanism and mounts the workpiece on the processing apparatus 5.

The plurality of processing apparatuses 5 are arranged at both sides of the intra-bay transfer paths 12. As described above, the processing apparatuses 5 performing the same process may be arranged in proximity as one group. Or, if one process is shared by the plurality of processing apparatuses 5, the plurality of processing apparatuses 5 may be arranged side by side in a processing order.

In the following description, it is assumed that the processing apparatuses 5 installed along one of transfer paths 12 in one process constitute one group 20. For example, a group 20 in FIG. 2 is constituted by devices 5a to 5f. The stoker 13 is provided in association with each group 20.

In FIG. 2, there are two types of transfer apparatuses 7: an inter-bay transfer apparatus 7a being moved on the inter-bay transfer path 11 and an intra-bay transfer apparatus 7b being moved on the intra-bay transfer paths 12. The transfer apparatus 7a temporarily stores workpieces in the stoker 13 associated with the group 20 including the processing apparatuses 5 processing the workpieces. The transfer apparatus 7b transfers the workpieces stored in the stoker 13 to the processing apparatuses 5. This embodiment involves a reduction of energy of the transfer apparatus 7b.

Figure 3:
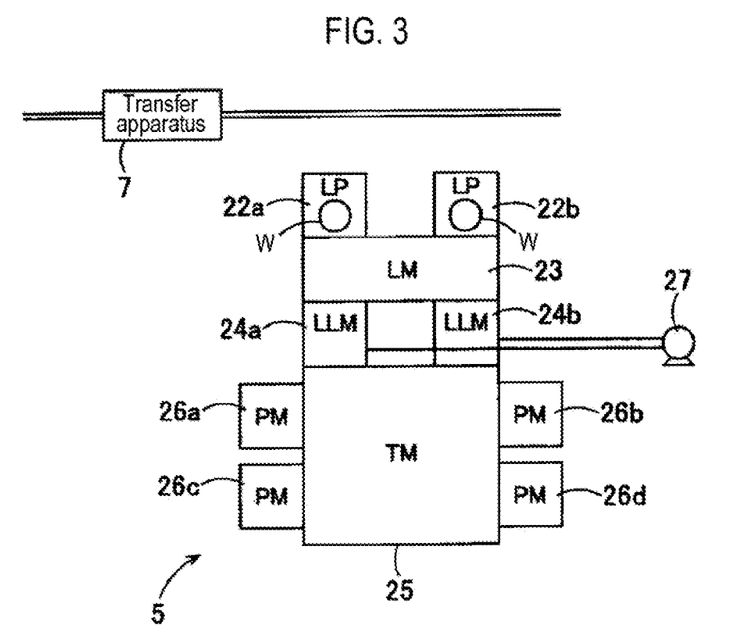
FIG. 3 is a block diagram illustrating an example configuration of a processing apparatus 5.

FIG. 3 is a block diagram illustrating an example configuration of the processing apparatus 5. The processing apparatus 5 is, for example, a multi-chamber type substrate processing system. The processing apparatus 5 includes a LM (Load Module) 23 provided with first and second LPs (Load Ports) 22a and 22b, which are loaded with carriers in order to transfer the carriers accommodating workpieces. A TM (Transfer Module) 25 is connected to the LM 23 via LLMs (Load Lock Modules) 24a and 24b. A vacuum robot (not shown) in the TM 25 transfers the workpieces, which are carried in via the LLMs 24a and 24b, to PMs (Process Modules) 26a to 26d. The PMs 26a to 26d perform a predetermined process for the workpieces based on a recipe. The processed workpieces are collected in the carriers loaded on the first LP 22a or the second LP 22b by going through a path reverse to the carrying-in of the workpieces. Then, the processed workpieces are carried out in the carrier units.

In the multi-chamber type substrate processing system shown in FIG. 3, the PMs 26a to 26d and the TM 25 remain in a vacuum at all times and the LLMs 24a and 24b and the TM 25 are partitioned by a gate valve (not shown). With the LLMs 24a and 24b remaining in a vacuum, the gate valve is opened and the workpieces are transferred between the PMs 26a to 26d and the LLMs 24a and 24b. The vacuum pump 27 places the LLMs 24a and 24b in a vacuum state.

Figure 4:
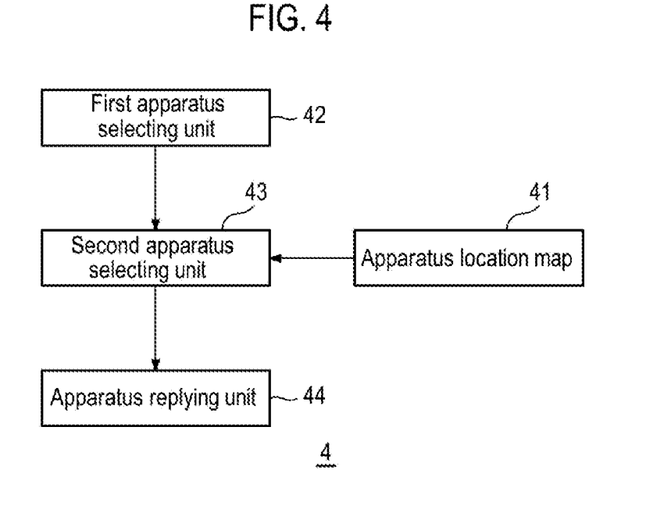
FIG. 4 is a block diagram illustrating an example internal configuration of a production efficiency improvement device 4 according to the first embodiment.

FIG. 4 is a block diagram illustrating an example internal configuration of the production efficiency improvement device 4 according to the first embodiment. The production efficiency improvement device 4 of FIG. 4 includes an apparatus location map 41, a first apparatus selecting unit 42, a second apparatus selecting unit 43 and an apparatus replying unit 44. The processing operation of the first apparatus selecting unit 42, the second apparatus selecting unit 43 and the apparatus replying unit 44 may be performed with either hardware or software. When the production efficiency improvement device 4 is implemented by a computer, all or some processes of the production efficiency improvement device 4 can be implemented by software, through the execution of a program (software) with the computer to perform the processing operation of various components of the production efficiency improvement device 4.

The apparatus location map 41 indicates positional information on each of the plurality of processing apparatuses 5 and holds, for example, positions as coordinates of the respective processing apparatuses 5. In FIG. 2, by referring to the apparatus location map 41, it can be seen that a transfer distance from the stoker 13 to each processing apparatus is small in decreasing order of processing apparatuses 5a, 5b, 5c, 5d, 5e and 5f if the workpieces are transferred counterclockwise with respect to the stoker 13. In addition, the transfer distance from the stoker 13 to each processing apparatus is small in decreasing order of processing apparatuses 5f, 5e, 5d, 5c, 5b and 5a if the workpieces are transferred clockwise with respect to the stoker 13.

Upon receiving an inquiry from the processing apparatus 5 preparing a random product lot from the scheduler 2 or the dispatcher 3, the first apparatus selecting unit 42 selects one or more processing apparatuses 5, which can process the workpieces, from the plurality of processing apparatuses 5 belonging to the group 20, based on the workpieces and the products manufactured using the workpieces. For example, the first apparatus selecting unit 42 uses a processing plan created by the scheduler 2 to exclude the processing apparatuses 5 which are in use or in maintenance, and then selects the processing apparatuses 5 in consideration of processes and precision required for the manufactured products.

The second apparatus selecting unit 43 selects one of the processing apparatuses 5 selected by the first apparatus selecting unit 42 in consideration of the apparatus location map 41. More specifically, for example, the second apparatus selecting unit 43 selects the processing apparatus 5 having the shortest transfer distance from the stoker 13 from among the processing apparatuses 5 selected by the first apparatus selecting unit 42, in order to reduce energy required to transfer the workpieces to the processing apparatuses 5.

The apparatus replying unit 44 replies to the scheduler 2 or the dispatcher 3, with the reply having the processing apparatus 5 selected by the second apparatus selecting unit 43 as a candidate for the processing apparatus 5 processing the workpieces.

As described above, one of the characteristics of this embodiment is to select a candidate for the processing apparatus 5 in consideration of the apparatus location map 41. If the apparatus location map 41 is not considered, the processing apparatus 5 far from the stoker 13 may be selected even when the processing apparatus 5 close to the stoker 13 can be used instead. In this case, a transfer distance from the stoker 13 to the processing apparatus 5 is increased, thereby consuming wasteful energy. In contrast, in this embodiment, since the processing apparatus 5 close to the stoker 13 is selected, the energy consumption can be reduced.

Figure 5:
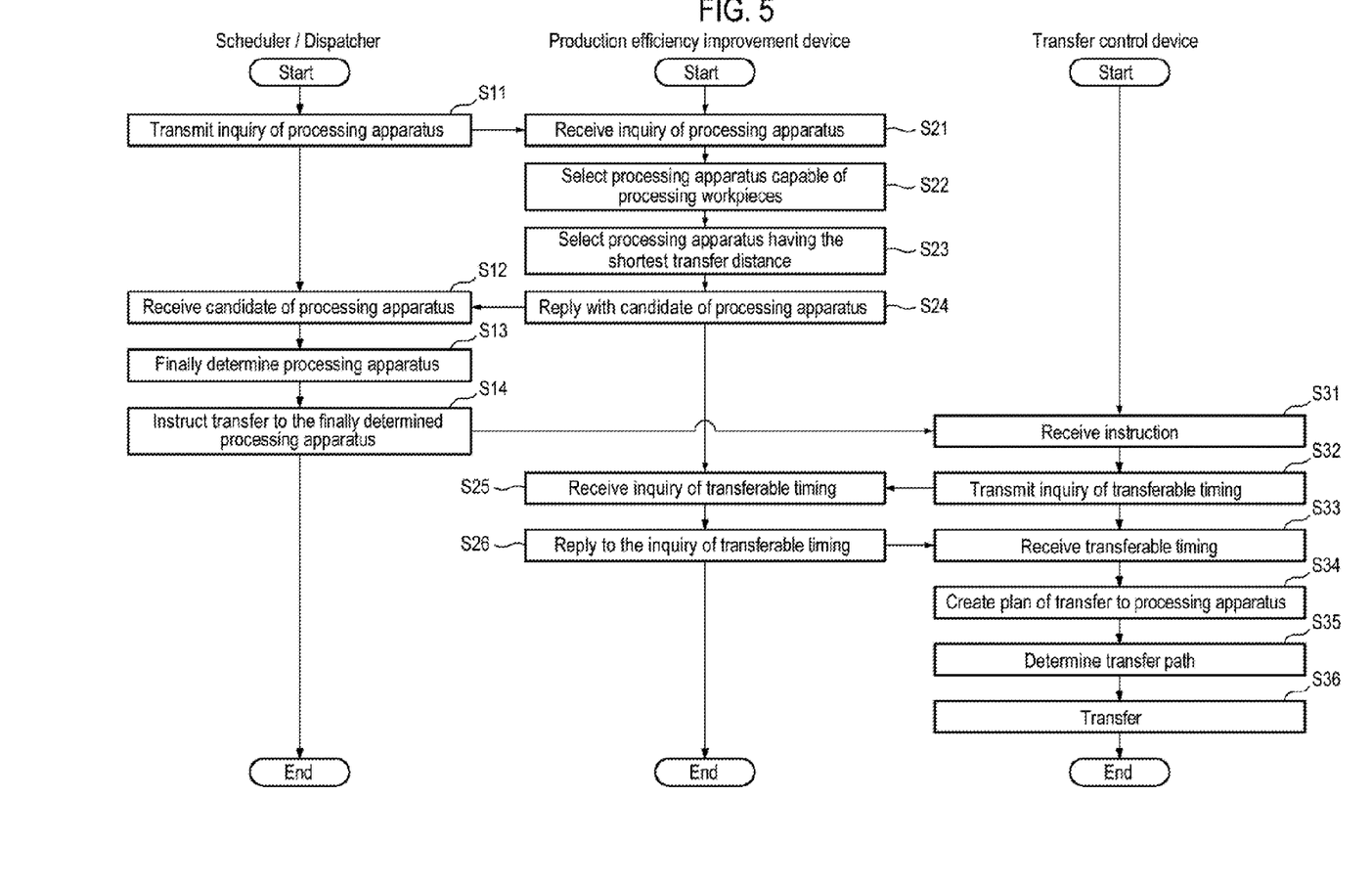
FIG. 5 is a flow chart illustrating an example processing operation of the production efficiency improvement device 4.

FIG. 5 is a flow chart illustrating an example processing operation of the production efficiency improvement system. First, the scheduler 2 or the dispatcher 3 transmits an inquiry of the processing apparatus 5 preparing a random product lot (Step S11). When the production efficiency improvement device 4 receives the inquiry (Step S21), the first apparatus selecting unit 42 of the production efficiency improvement device 4 selects one or more processing apparatuses 5 which can process the workpieces (Step S22). Subsequently, the second apparatus selecting unit 43 selects the processing apparatus 5 having the shortest transfer distance from the stoker 13 from among the processing apparatuses 5 selected by the first apparatus selecting unit 42 (Step S23). The apparatus replying unit 44 replies to the dispatcher 3, with the reply having the processing apparatus 5 selected by the second apparatus selecting unit 43 as a candidate for the processing apparatus 5 processing the workpieces (Step S24).

Upon receiving the candidate for the processing apparatus 5 (Step S12), the scheduler 2 or the dispatcher 3 finally determines the candidate for the replied processing apparatus 5 (Step S13). Then, the scheduler 2 or the dispatcher 3 instructs the transfer control device 8 to transfer the workpieces stored in the stoker 13 to the processing apparatus 5 finally determined (Step S14).

Upon receiving the transfer instruction (Step S31), the transfer control device 8 inquires of the production efficiency improvement device 4 about a timing at which the workpieces can be transferred to the processing apparatus 5 finally determined (Step S32). In response to this inquiry, the production efficiency improvement device 4 replies to the transfer control device 8 with the timing at which the workpieces can be transferred to the processing apparatus 5 (Steps S25 and S26). Upon receiving the timing at which the workpieces can be transferred (Step S33), the transfer control device 8 creates a plan for a transfer to the processing apparatus 5 with the timing set to a scheduled timing of transfer (Step S34).

Based on the created transfer plan, the transfer control device 8 determines the optimal transfer path along which the workpieces are transferred from the stoker 13 to the processing apparatus 5 (Step S35). Then, the transfer control device 8 controls the transfer apparatus 7b to transfer the workpieces stored in the stoker 13 to the processing apparatus 5 along the determined transfer path (Step S36).

In this manner, in the first embodiment, since the processing apparatus 5 performing a process is selected in consideration of an arrangement of each processing apparatus 5, it is possible to decrease the transfer distance of the transfer apparatus 7*b*, which can result in a reduction of energy consumption.

Second Embodiment

A second embodiment involves reducing energy consumption by moving the transfer apparatus 7*b* efficiently. The general configuration of the production efficiency improvement system 1 according to the second embodiment of the present disclosure is illustrated by the same block diagram as FIG. 1.

Figure 6:
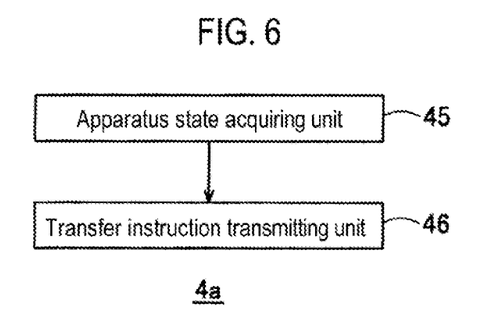
FIG. 6 is a block diagram illustrating an example internal configuration of a production efficiency improvement device 4a according to a second embodiment.

FIG. 6 is a block diagram illustrating an example internal configuration of the production efficiency improvement device 4*a* according to the second embodiment. The production efficiency improvement device 4*a* of FIG. 6 includes an apparatus state acquiring unit 45 and a transfer instruction transmitting unit 46.

The apparatus state acquiring unit 45 acquires a state of each processing apparatus 5, more specifically, information on whether the processing apparatus 5 can mount the workpieces, from the processing apparatus controller 6.

The transfer instruction transmitting unit 46 transmits a transfer instruction to the transfer control device 8 and moves the transfer apparatus 7*b* to the processing apparatus 5 in two steps. First, the transfer instruction transmitting unit 46 makes an instruction to move the transfer apparatus 7*b* from the stoker 13 to a standby position near the processing apparatus 5. Thereafter, when the apparatus state acquiring unit 45 acquires the information indicating that the processing apparatus 5 at a loading destination of the workpieces can mount the workpieces, the transfer instruction transmitting unit 46 makes an instruction to move the transfer apparatus 7*b* from the standby position to the processing apparatus 5.

Figure 7:
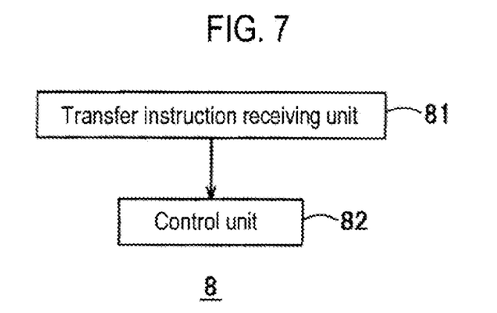
FIG. 7 is a block diagram illustrating an example internal configuration of a transfer control device 8 according to the second embodiment.

FIG. 7 is a block diagram illustrating an example internal configuration of the transfer control device 8 according to the second embodiment. The transfer control device 8 of FIG. 7 includes a transfer instruction receiving unit 81 and a control unit 82. The transfer instruction receiving unit 81 receives a transfer instruction from the production efficiency improvement device 4*a*. Based on the transfer instruction, the control unit 82 moves the transfer apparatus 7*b*.

The processing operation of various components of the production efficiency improvement device 4*a* of FIG. 6 and the transfer control device 8 of FIG. 7 may also be performed by either hardware or software.

Figure 8:
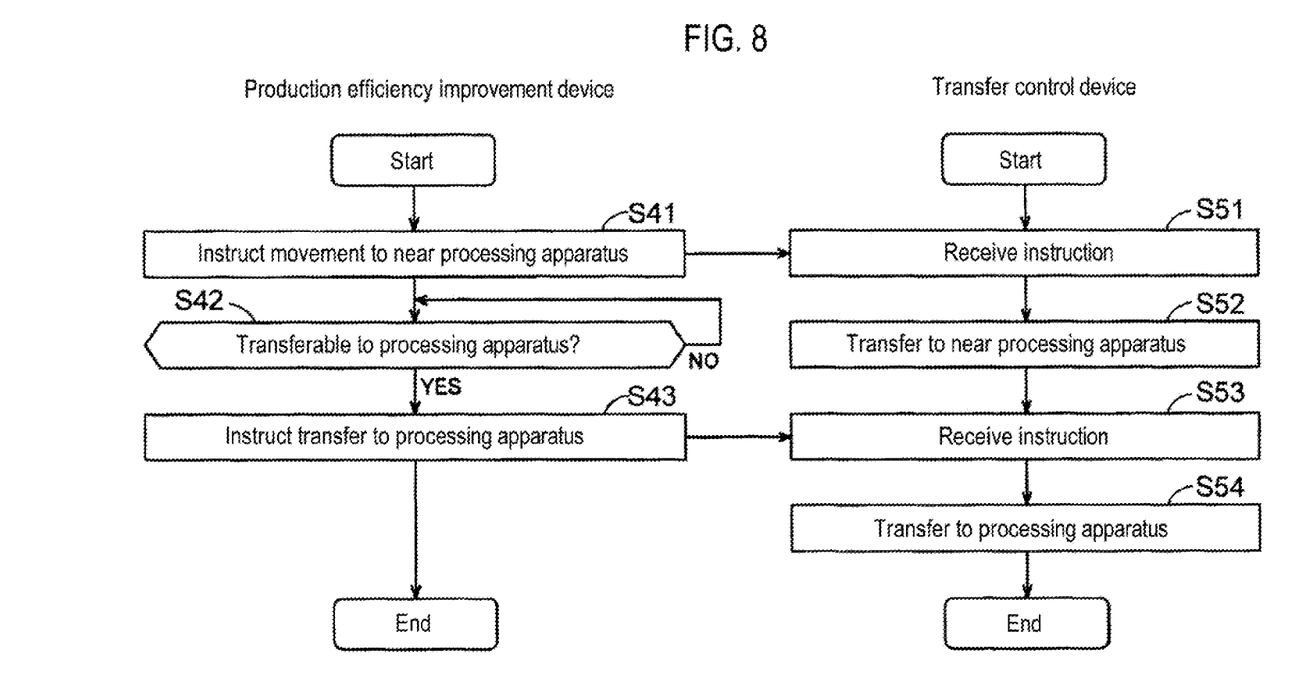
FIG. 8 is a sequence view illustrating an example processing operation of the production efficiency improvement device 4a and the transfer control device 8.

FIG. 8 is a sequence view illustrating an example processing operation of the production efficiency improvement device 4*a* and the transfer control device 8. It is here assumed that the processing apparatus 5 processing the workpieces is predetermined. A method of determining the processing apparatus 5 is not particularly limited. For example, the processing apparatus 5 may be determined based on the apparatus location map 41 as described in the first embodiment or may be determined without considering a position of each processing apparatus 5. It is also assumed that the transfer plan and the optimal transfer path are predetermined by the transfer control device 8.

In this embodiment, the transfer instruction is made from the scheduler 2 or the dispatcher 3 to the transfer control device 8 through the production efficiency improvement device 4*a*. When the scheduler 2 or the dispatcher 3 transmits the transfer instruction based on the transfer plan, the transfer instruction transmitting unit 46 of the production efficiency improvement device 4*a* transmits the transfer instruction to move the transfer apparatus 7*b* from the stoker 13 to the standby position near the processing apparatus 5 performing a process to the transfer control device 8, based on a processing plan of the plurality of processing apparatuses 5 (Step S41).

When the transfer instruction receiving unit 81 of the transfer control device 8 receives this transfer instruction (Step S51), the control unit 82, based on the transfer information, moves the transfer apparatus 7*b* from the stoker 13 to the standby position along the determined transfer path and transfers the workpieces to the standby position (Step S52). Then, the control unit 82 stops a supply of energy to the transfer apparatus 7*b* in the standby position to halt the movement. This allows the transfer apparatus 7*b* to consume less energy.

The reason why the workpieces are not directly carried into the processing apparatus 5 is that the processing apparatus 5 may not be necessarily under a state where the processing apparatus 5 can mount the workpieces as it is processing other workpieces or is in a sleep state. Processing efficiency can be improved by transferring the workpieces to the standby position near the processing apparatus 5 in advance before the processing apparatus 5 enters the state where it can mount the workpieces.

Figure 9A:
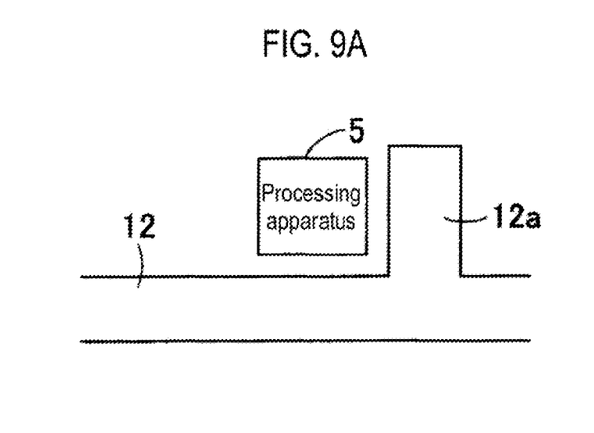
FIGS. 9A and 9B are views illustrating an example of a standby path.
Figure 9B:
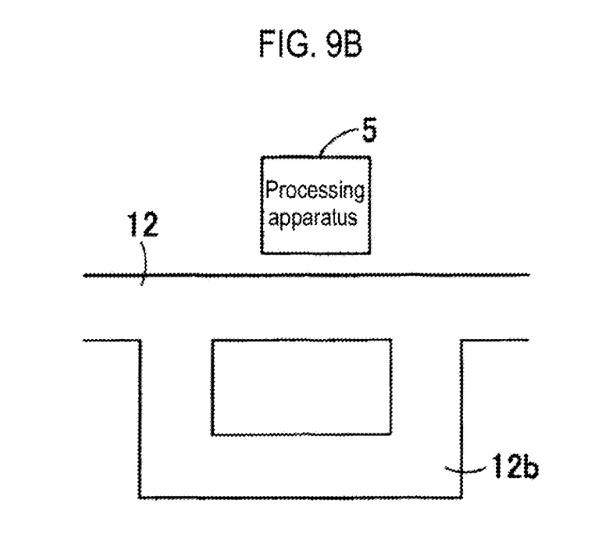

The standby position is set at least such that a transfer distance from the standby position to the processing apparatus 5 becomes smaller than a transfer distance from the stoker 13 to the processing apparatus 5. The standby position may be set on the intra-bay transfer path 12 of FIG. 2, or alternatively, a standby path for temporarily evacuating the transfer apparatus 7*b* may be provided. The standby path may be branched from the intra-bay transfer path 12. For example, the standby path may be a T-shaped path 12*a* branched from the intra-bay transfer path 12 as shown in FIG. 9A or may be a bypass path 12*b* of the intra-bay transfer path 12 as shown in FIG. 9B. This standby path can allow the transfer apparatus 7*b* to wait without interrupting the movement of another transfer apparatus 7*b*.

Thereafter, when the apparatus state acquiring unit 45 of the production efficiency improvement device 4*a* acquires the information indicating that the processing apparatus 5 at the loading destination of the workpieces can mount the workpieces ("YES" in Step S42), the transfer instruction transmitting unit 46 transmits a transfer instruction to move the transfer apparatus 7*b* from the standby position to the processing apparatus 5 to the transfer control device 8 (Step S43).

When the transfer instruction receiving unit 81 of the transfer control device 8 receives this transfer instruction (Step S53), the control unit 82 supplies energy to the transfer apparatus 7*b* and moves the transfer apparatus 7*b* from the standby position to the processing apparatus 5, based on the transfer instruction. Thus, the workpieces are transferred to and mounted on the processing apparatus 5 (Step S54).

If the transfer control device 8 cannot receive an instruction to carry the workpieces into the processing apparatus 5 from the production efficiency improvement device 4*a*, the transfer control device 8 does not know when to move the transfer apparatus 7*b* to the processing apparatus 5. Therefore, the transfer apparatus 7*b* has to circulate on the intra-bay transfer path 11 until the processing apparatus 5 enters the state where it can mount the workpieces, which may result in wasteful energy consumption.

In contrast, in this embodiment, the transfer control device 8 is associated with the production efficiency improvement device 4*a*. This allows the transfer apparatus 7*b* to stay at the standby position until the processing apparatus 5 enters the state where it can mount the workpieces, which may result in a reduction of energy consumption as compared to the case when the transfer apparatus 7b circulates. In addition, since the standby position is set near the processing apparatus 5, when the processing apparatus 5 enters the state where it can mount the workpieces, the workpieces can be quickly transferred to the processing apparatus 5. Thus, this can result in improvement of processing efficiency.

In this manner, in the second embodiment, the workpieces are first transferred near the processing apparatus, the transfer apparatus 7b is halted, and thereafter, the workpieces are carried into the processing apparatus 5 when the processing apparatus 5 enters the state where it can mount the workpieces. Therefore, since the transfer apparatus 7b can be efficiently moved, energy consumption can be reduced. In addition, it is possible to suppress hardware, for example, a temporary storage such as a buffer installed near the device, to a minimum required level.

Third Embodiment

A third embodiment involves adjusting the total amount of energy consumption in the plurality of processing apparatuses 5 and the transfer apparatus 7 below the maximum energy consumption.

The general configuration of the production efficiency improvement system 1 according to a third embodiment of the present disclosure is illustrated by the same block diagram as FIG. 1. In this embodiment, assuming that the maximum energy consumption in the production efficiency improvement system 1 is predetermined by contracts with a power company or the like, each processing apparatus 5 and the transfer apparatus 7 are operated within a range that does not exceed the maximum of energy consumption.

The production efficiency improvement system 1 according to the third embodiment is based on the premise that a workpiece is processed for each lot. In one lot, the plurality of workpieces is processed in one or more processing apparatuses 5. It is here assumed that the plurality of processing apparatuses 5 is classified into a plurality of groups, each group including two or more processing apparatuses 5 performing the same process. In one group, the plurality of processing apparatuses 5 belonging to the group can be used to process the plurality of workpieces in the same lot.

In another lot, the same or different workpieces may be processed. The number of workpieces to be processed in each lot may be the same or different. The information on the type and the number of workpieces processed in each lot is included in a processing plan of the processing apparatus 5 which is created by the scheduler 2.

A processing apparatus controller (energy consumption managing unit) 6 connected to each processing apparatus 5 detects energy consumption of the corresponding processing apparatus 5 for each lot. Energy consumption of each processing apparatus 5 detected in each processing apparatus controller 6 is sent to and collected in the production efficiency improvement device 4 for each lot. Based on the energy consumption of each processing apparatus managed by each processing apparatus controller 6 and the results of processing by the scheduler 2 and the dispatcher 3, the production efficiency improvement device 4 determines whether or not each processing apparatus processes the workpiece in such a manner that the total amount of energy consumption in the plurality of processing apparatuses does not exceed the predetermined maximum energy consumption. In addition, the production efficiency improvement device 4 individually adjusts a processing timing of each processing apparatus operated in each lot in such a manner that the total amount of energy consumption in the plurality of processing apparatuses during a process of each lot does not exceed the maximum energy consumption. That is, the production efficiency improvement device 4 manages the lot information, the type of processing apparatus in each lot, and the timing at which each processing apparatus is operated in each lot.

Figure 10:
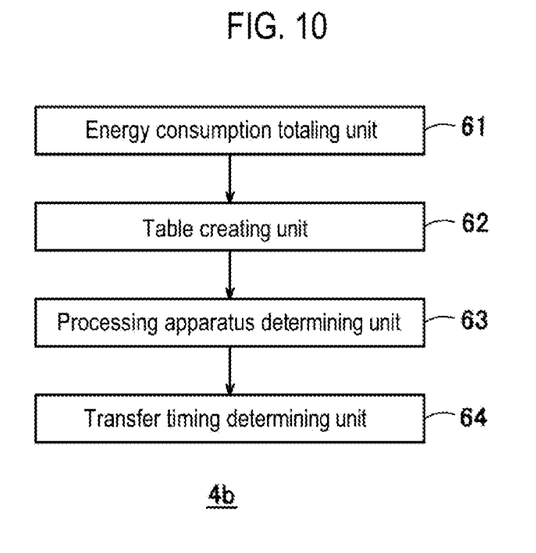
FIG. 10 is a block diagram illustrating an example internal configuration of a production efficiency improvement device 4b according to a third embodiment.

FIG. 10 is a block diagram illustrating an internal configuration of a production efficiency improvement device 4b according to the third embodiment. The production efficiency improvement device 4b of FIG. 10 includes an energy consumption totaling unit 61 configured to sum energy consumption provided from each processing apparatus controller 6, a table creating unit 62 configured to tabulate the total amount of energy consumption for each lot, a processing apparatus determining unit 63 configured to determine the processing apparatus 5 to process the next lot, and a transfer timing determining unit 64 configured to determine a timing at which a workpiece is transferred up to each processing apparatus 5 determined for processing.

Based on results of the process by the scheduler 2 and the dispatcher 3, the processing apparatus determining unit 63 detects the type and the number of workpieces to be processed in the next lot, obtains the maximum number of operable processing apparatuses 5 within a range that does not exceed the predetermined maximum of energy consumption by referring to the table creating unit 62, thereby handles the next lot to be processed within a given time. In addition, the processing apparatus determining unit 63 individually adjusts a processing timing of each processing apparatus operated in each lot in such a manner that the total amount of energy consumption in the plurality of processing apparatuses during processing of each lot does not exceed the maximum of energy consumption.

Each processing apparatus 5 determined in the processing apparatus determining unit 63 receives a processing instruction at a predetermined timing via the processing apparatus controller 6. In accordance with this, the production efficiency improvement device 4b instructs the transfer control device 8 to transfer the workpieces up to each processing apparatus 5, based on the transfer timing determined in the transfer timing determining unit 64.

In the above description, an example is explained in which the total amount of energy consumption in the plurality of processing apparatuses 5 is controlled such that it does not exceed the predetermined maximum of energy consumption. However, the amount of energy consumed in the case when the workpieces are transferred by the transfer apparatus 7 may be additionally considered, such that the sum of this energy consumption and the total amount of energy consumption in the plurality of processing apparatuses 5 does not exceed the maximum of energy consumption.

In this case, the amount of energy consumption required for the transfer apparatus 7 to transfer the workpiece by the unit distance may be registered in advance to the table creating unit 62. The production efficiency improvement device 4 determines the processing apparatus 5 processing the workpiece for each lot, determines a timing at which the workpiece is transferred up to each determined processing apparatus 5, and controls the sum of the total amount of energy consumption in each determined processing apparatus 5 and the amount of energy consumption required to transfer the workpiece up to each determined processing apparatus 5 not to exceed the maximum energy consumption.

More specifically, in order to provide the maximum processing efficiency of a lot, the transfer timing of the transfer apparatus 7 is scheduled to maximize the number of processing apparatuses 5 processing the workpieces belonging to the lot and to transfer the workpieces to each processing apparatuses 5 through the shortest path. Thus, the workpieces can be transferred with the shortest distance and as many workpieces as possible can be substantially simultaneously processed in the processing apparatuses 5. Accordingly, it becomes possible to limit the total amount of energy consumption and maximize production efficiency.

In addition, scheduling may be performed such that the sum of the amount of energy consumption in the processing apparatus 5 and the transfer apparatus 7 included in the production efficiency improvement system 1 of FIG. 1 and the amount of energy consumption in other devices does not exceed the maximum of energy consumption.

In addition, this embodiment may be combined with the first embodiment. That is, the processing apparatus determining unit 63 may determine the processing apparatus 5 processing the workpieces by referring to the apparatus location map 41 and considering an arrangement of each processing apparatus 5. In addition, this embodiment may be combined with the second embodiment. That is, the apparatus state acquiring unit 45 and the transfer instruction transmitting unit 46 of FIG. 6 may be included in the production efficiency improvement device 4b of FIG. 10. Then, when the workpieces are transferred up to the processing apparatus 5 along the transfer path determined by the transfer timing determining unit 64, the workpieces may be halted at the standby position until the processing apparatus enters the state where it can mount the workpieces.

In this manner, in the third embodiment, the processing schedule of the processing apparatus 5 is created for each lot such that the amount of energy consumption in the processing apparatus 5 does not exceed the maximum of energy consumption. Thus, it is possible to perform the process for each lot efficiently within the range of the maximum energy consumption. In addition, by considering the amount of energy consumption in the transfer apparatus 7, it is possible to schedule the processing apparatus 5 and the transfer apparatus 7 for each lot, such that the total amount of energy consumption in the production efficiency improvement system 1 does not exceed the maximum energy consumption.

At least some of the production efficiency improvement system 1 described in the above embodiment may be implemented by either hardware or software. In the latter, a program implementing at least some functions of the production efficiency improvement system 1 may be stored in a recording medium such as a flexible disk or a CD-ROM and may be read and executed by a computer. The recording medium may be either a removable recording medium such as a magnetic disk or an optical disk, or a fixed recording medium such as a hard disk or a memory.

In addition, the program implementing at least some functions of the production efficiency improvement system 1 may be distributed via a communication link (including wireless communication) such as Internet. In addition, with this program encoded, modulated or compressed, the program may be distributed via a wired link such as the Internet, or a wireless link or with the program stored in a recording medium.

According to the present disclosure, it is possible to reduce energy consumption of a transfer apparatus.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A wafer or substrate production processing system comprising:
 a production efficiency improvement device configured to determine a distance between workpieces and each of a plurality of processing apparatuses arranged along a transfer path, and select a processing apparatus for processing the workpieces based on the determined distance between the workpieces and each of the plurality of processing apparatuses arranged along the transfer path;
 a transfer control device configured to move a transfer apparatus that transfers workpieces from a predetermined position on the transfer path to the selected processing apparatus; and
 a plurality of energy consumption managing units provided for the plurality of processing apparatuses and configured to manage energy consumption of the corresponding processing apparatuses,
 wherein the production efficiency improvement device includes:
  a first apparatus selecting unit which selects one or more processing apparatuses that processes workpieces from the plurality of processing apparatuses; and
  a second apparatus selecting unit which selects a processing apparatus having the shortest transfer distance from the predetermined position, from the one or more processing apparatuses selected by the first apparatus selecting unit based on positional information including the determined distance between the workpieces and each of the plurality of processing apparatuses, and
 wherein the production efficiency improvement device selects a processing apparatus processing the workpieces such that a total energy consumption of the plurality of processing apparatuses and the transfer apparatus does not exceed a predetermined maximum energy consumption, based on the energy consumption of the processing apparatuses managed by the energy consumption managing units and the energy consumption of the transfer apparatus.

2. The production processing system of claim 1, wherein the predetermined position has a stoker that temporarily stores the workpieces and is provided at an end portion of the transfer path where the plurality of processing apparatuses are provided.

3. The production processing system of claim 1, wherein the production efficiency improvement device includes an apparatus state acquiring unit that acquires a state of the selected processing apparatus, and
 wherein the transfer control device moves the transfer apparatus from the predetermined position to a standby position near the selected processing apparatus, halts the transfer apparatus at the standby position, and then, moves the transfer apparatus from the standby position to the selected processing apparatus when the apparatus state acquiring unit acquires information indicating that the selected processing apparatus enters a state where the selected processing apparatus can receive the workpieces.

4. The production processing system of claim 3, further comprising:
   a main transfer path along which the transfer apparatus is moved between the predetermined position and the processing apparatus; and
   a standby path which is provided near the processing apparatus and branched from the main transfer path,
   wherein the standby position is located on the standby path.

5. A wafer or substrate production efficiency improvement device comprising:
   an apparatus selecting unit configured to determine a distance between workpieces and each of a plurality of processing apparatuses arranged along a transfer path, and select a processing apparatus that processes workpieces and has the shortest transfer distance from a predetermined position on the transfer path based on the determined distance between the workpieces and each of the plurality of processing apparatuses arranged along the transfer path;
   a plurality of energy consumption managing units provided for the plurality of processing apparatuses and configured to manage energy consumption of the corresponding processing apparatus;
   a first apparatus selecting unit which selects one or more processing apparatuses that processes workpieces from the plurality of processing apparatuses; and
   a second apparatus selecting unit which selects a processing apparatus having the shortest transfer distance from the predetermined position, from the one or more processing apparatuses selected by the first apparatus selecting unit base on positional information including the determined distance between the workpieces amd each of the plurality of processing apparatuses,
   wherein the production efficiency improvement device selects a processing apparatus processing the workpieces such that a total energy consumption of the plurality of processing apparatuses and a transfer apparatus does not exceed a predetermined maximum energy consumption, based on the energy consumption of the processing apparatuses managed by the energy consumption managing units and the energy consumption of the transfer apparatus.

* * * * *

UNITED STATES PATENT AND TRADEMARK OFFICE
CERTIFICATE OF CORRECTION

PATENT NO. : 10,012,980 B2
APPLICATION NO. : 14/303059
DATED : July 3, 2018
INVENTOR(S) : Taku Mizutani et al.

Page 1 of 1

It is certified that error appears in the above-identified patent and that said Letters Patent is hereby corrected as shown below:

Claim 5, Column 14, Line 13, please delete the word "amd" and replace with "and".

Signed and Sealed this
Second Day of April, 2019

Andrei Iancu
*Director of the United States Patent and Trademark Office*